US008686539B1

(12) United States Patent
Kireev et al.

(10) Patent No.: US 8,686,539 B1
(45) Date of Patent: Apr. 1, 2014

(54) INDUCTOR HAVING A DEEP-WELL NOISE ISOLATION SHIELD

(75) Inventors: Vassili Kireev, Sunnyvale, CA (US); Parag Upadhyaya, San Jose, CA (US); Toan D. Tran, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 304 days.

(21) Appl. No.: 12/906,026

(22) Filed: Oct. 15, 2010

(51) Int. Cl.
*H01L 27/08* (2006.01)

(52) U.S. Cl.
USPC .......................................................... 257/531

(58) Field of Classification Search
USPC .......................................... 257/531, E29.001
See application file for complete search history.

(56) References Cited

U.S. PATENT DOCUMENTS

2001/0040270 A1* 11/2001 Kobayashi ..................... 257/531
2009/0146252 A1* 6/2009 Huang et al. .................. 257/531

OTHER PUBLICATIONS

Jian, Hongyan et al., Standard CMOS Technology On-Chip Inductors with *pn* Junctions Substrate Isolation, Design Automation Conference, ASP-DAC 2005, Asia and South Pacific, Jan. 18-21, 2005, vol. 2, pp. D5-D6.

Shi, Jinglin, et al., The Enhancement of Q Factor for Patterned Ground Shield Inductors at High Temperatures, IEEE Transactions on Magnetics, vol. 42, No. 7, Jul. 2006, pp. 1873-1875.
Wu, Yu-Chen, et al., Substrate Noise Coupling Reduction in LC Voltage-Controlled Oscillators, IEEE Electron Device Letters, vol. 30, No. 4, Apr. 2009, pp. 383-385.
Yim, Seong-Mo, et al., The Effects of a Ground Shield on the characteristics and Performance of Spiral Inductors, IEEE Journal of Solid-State Circuits, vol. 37, No. 2, Feb. 2002, pp. 237-244.
Yoshitomi, Takashi, et al., On-Chip Spiral Inductors with Diffused Shields Using Channel-Stop Implant, Technical Digest International, IDEM98, Dec. 1998, pp. 540-543.
Yue, C. Patrick et al., On-Chip Spiral Inductors with Patterned Ground Shields for Si-Based RF IC's, IEEE Journal of Solid-State Circuits, vol. 33, No. 5, May 1998, pp. 743-752.

* cited by examiner

*Primary Examiner* — Vongsavanh Sengdara
(74) *Attorney, Agent, or Firm* — LeRoy D. Maunu

(57) ABSTRACT

A shielded inductor in an integrated circuit includes conductive loops disposed on a deep-well noise shield for isolating a noise coupling between the conductive loops and the substrate of the integrated circuit. The deep-well noise shield includes a first well disposed within a second well that is disposed within the substrate of the integrated circuit. The second well includes a peripheral well, a deep-well layer, and slot wells. The peripheral well surrounds a periphery of the first well. The peripheral well and the deep-well layer are coupled together to provide two p-n junctions that separate the first well and the substrate. The slot wells are distributed inside the periphery of the first well. Each slot well and the deep-well layer are coupled together. Each slot well has a width and a length that is at least three times the width.

17 Claims, 3 Drawing Sheets

INDUCTOR HAVING A DEEP-WELL NOISE ISOLATION SHIELD

FIELD OF THE INVENTION

One or more embodiments generally relate to inductors, and more particularly to shielded inductors implemented in an integrated circuit.

BACKGROUND

Inductors are useful for implementing various circuits including impedance matching networks. However, inductors for high-performance circuits require careful control of magnetic flux linkage and substrate noise coupling. Because of this, in integrated circuits that include many closely-spaced inductors, magnetic and substrate coupling limits jitter performance and/or density of inductive components.

One or more embodiments of the present invention may address one or more of the above issues.

SUMMARY

In an embodiment, a shielded inductor in an integrated circuit includes conductive loops disposed on a deep-well noise shield for isolating a noise coupling between the conductive loops and the substrate of the integrated circuit. The deep-well noise shield includes a first well disposed within a second well that is disposed within the substrate of the integrated circuit. The second well includes a peripheral well, a deep-well layer, and slot wells. The peripheral well surrounds a periphery of the first well. The peripheral well and the deep-well layer are coupled together to provide two p-n junctions that separate the first well and the substrate. The slot wells are distributed inside the periphery of the first well. Each slot well and the deep-well layer are coupled together. Each slot well has a width and a length that is at least three times the width.

In an embodiment, a shielded inductor in an integrated circuit includes conductive loops disposed on a deep-well noise shield for isolating a noise coupling between the conductive loops and the substrate of the integrated circuit. The deep-well noise shield includes a first well disposed within a second well that is disposed within the substrate of the integrated circuit. The second well includes a peripheral well, a deep-well layer, and slot wells. The peripheral well surrounds a periphery of the first well. The peripheral well and the deep-well layer are coupled together. The slot wells are distributed inside the periphery of the first well. The slot wells are coupled to the deep-well layer and subdivide the first well into a plurality of separate wells. For each separate well, the peripheral well and the deep-well layer provide two p-n junctions that separate the separate well and the substrate.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Figure 1:
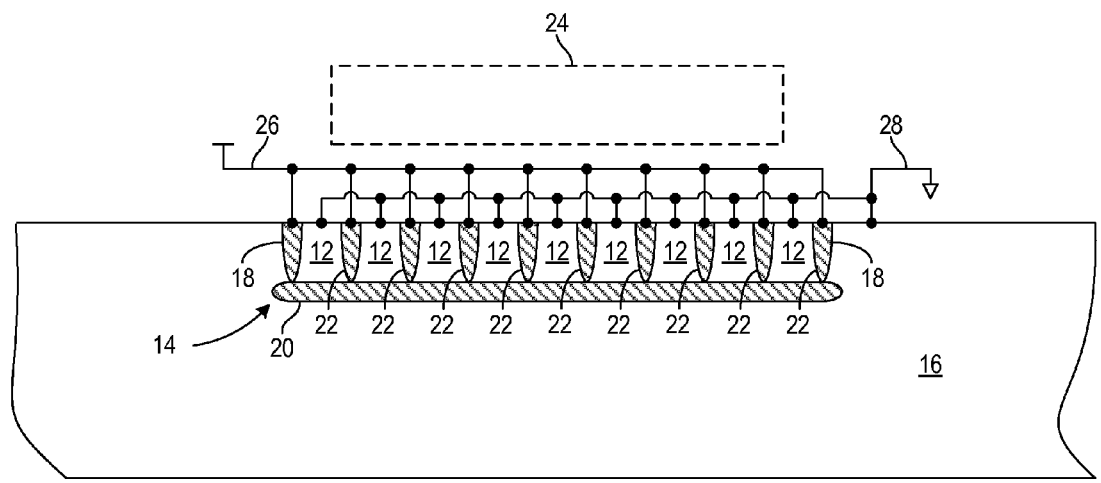
FIG. 1 is a schematic diagram of an inductor disposed on a deep well noise shield in accordance with one or more embodiments of the invention.

FIG. 1 is a schematic diagram of an inductor deposed on a deep well noise shield in accordance with one or more embodiments of the invention. The deep-well noise shield includes a first well 12 disposed within a second well 14 (shown cross-hatched) that is disposed within a substrate 16 of an integrated circuit. The second well 14 includes a peripheral well 18, a deep-well layer 20, and multiple slot wells 22. The peripheral well 18 surrounds a periphery of the first well 12. The peripheral well 18 and the deep-well layer 20 are coupled together to provide two p-n junctions that separate the first well 12 and the substrate 16. The slot wells 22 are distributed inside the periphery of the first well 12. Each of the slot wells 22 and the deep-well layer 20 are coupled together. The inductor 24 is disposed on the deep-well noise shield for isolating a noise coupling between the inductor 24 and the substrate 16.

In one embodiment, a VDD power supply network on line 26 and a ground power network on line 28 bias the deep well noise shield. The VDD power supply network on line 26 biases the peripheral well 18 and the slot wells 22, and biases the deep-well layer 20 because it is coupled to the peripheral well 18 and the slot wells 22. The ground power network on line 28 biases the first well 12 and the substrate 16.

Figure 2:
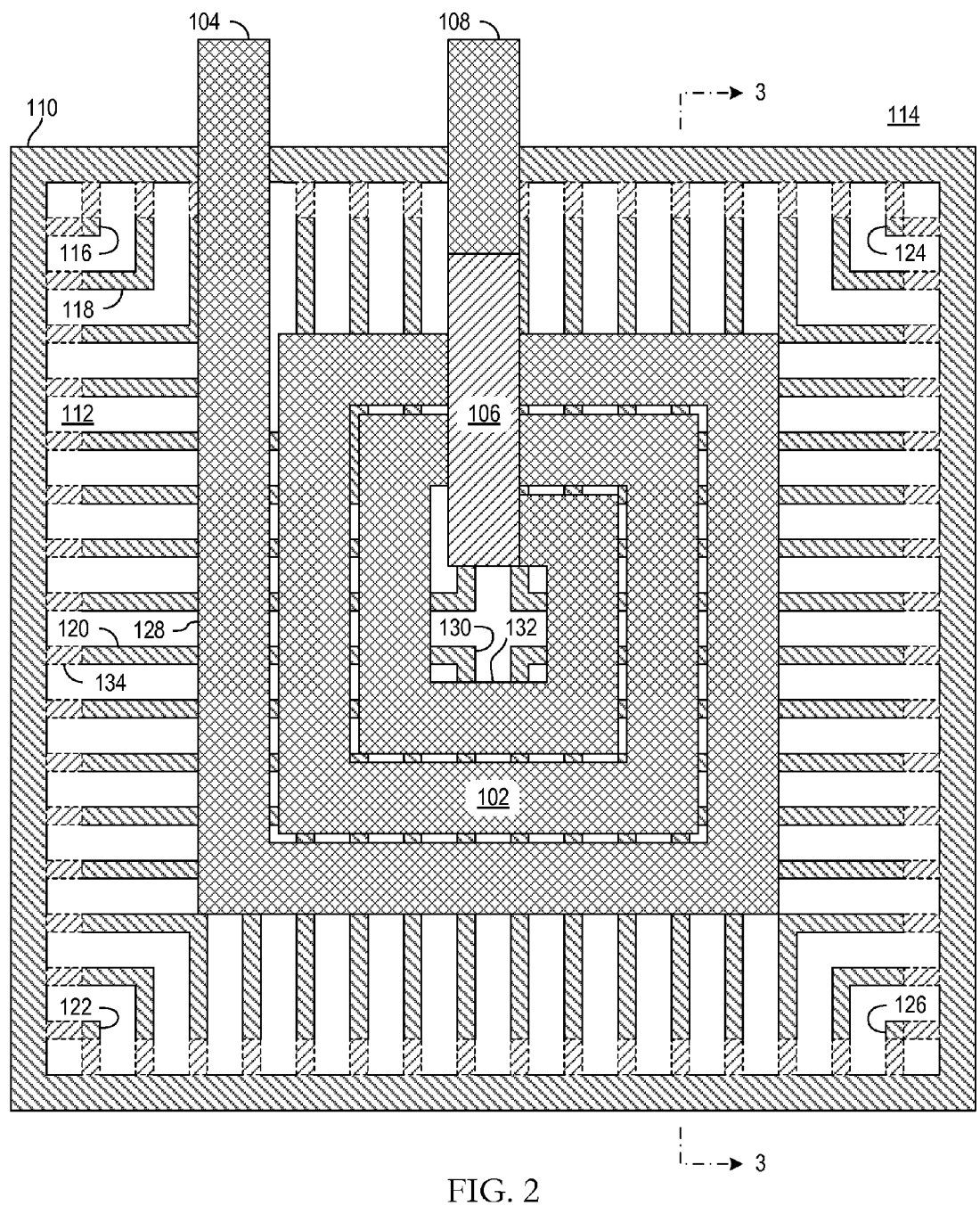
FIG. 2 is a layout diagram of an example three-loop inductor deposed on a deep well noise shield in accordance with one or more embodiments of the invention.

FIG. 2 is a layout diagram of an example three-loop inductor disposed on a deep-well noise shield in accordance with one or more embodiments of the invention. One or more conductive loops are disposed on the deep-well noise shield to isolate noise coupling between the conductive loops and the substrate of the integrated circuit.

The example inductor includes a spiral 102 of loops on a metal layer of an integrated circuit. In one embodiment, the spiral 102 is in a lower metal layer of the fabrication process for the integrated circuit to keep the spiral 102 close to the deep-well noise shield. An outer terminal of the spiral 102 connects to one electrode 104 of the example inductor, and crossover 106 on a higher metal layer connects an inner terminal of the spiral 102 to the other electrode 108 of the example inductor.

In other embodiments, the inductor has fewer or more than three loops and each loop has any shape that surrounds an area. Thus, in addition to the illustrated approximately square loops, the loops are rectangular, octagonal, and/or circular in other embodiments. Furthermore, more than two metal layers implement the inductor in certain embodiments. For example, in one embodiment the inductor has twelve circular loops that are similarly sized on respective metal layers, and the loops are stacked and interconnected to form an approximately helical configuration of the inductor.

A peripheral well 110 forms an outer boundary of the deep-well noise shield. The peripheral well 110 surrounds an inner well 112. For clarity, the inner well 112 is shown as "white space" inside the peripheral well 110 wherever the inductor does not cover the inner well 112. Thus, the peripheral well 110 surrounds a periphery of the inner well 112. Outside the peripheral well 110, the substrate 114 is also shown as "white space." The inner well 112 and the substrate 114 have a type that is complementary to the type of the peripheral well 110. In one embodiment, the inner well 112 is a p-type well and the substrate 114 is a p-type substrate, and the peripheral well 110 is an n-type well.

Multiple slot wells 116, 118, 120, 122, 124, 126, and so on are distributed inside the periphery of the inner well 112. Each of the slot wells 116, 118, 120, 122, 124, and 126 has a length and a width, and the length of each slot well is generally, but not necessarily, three or more times greater than its width. Each slot well has a length is at least ten times greater than its width in one embodiment.

In one embodiment, the length of a slot well is orientated perpendicular to a proximate portion of the conductive loops, and the width of the slot well is oriented parallel to the proximate portion. For example, the length of slot well 120 is orientated perpendicular to proximate portion 128, and the width of slot well 120 is orientated parallel to proximate portion 128. Thus, the inductor does not induce appreciable currents in the deep-well noise shield because the slot wells 116, 118, 120, 122, 124, and 126 block induced circular currents. This preserves the inductance of the inductor from reduction because there are no induced circular currents to interfere with the magnetic field generated by the current through the inductor spiral 102.

In one embodiment, the shape of the deep-well noise shield matches the shape of the inductor. In one example, the deep-well noise shield for a circular inductor is circular with radial slot wells.

One or more of the slot wells include one or more bends in certain embodiments. For example, slot well 120 includes bend 130, and the length of one portion of slot well 120 is orientated perpendicular to proximate port 128 of the conductive loops of spiral 102, and another portion of slot well 120 is orientated perpendicular to proximate portion 132 of the conductive loops of spiral 102. The bends in the slot wells 116, 118, 120, 122, 124, and 126 keep the slot wells orientated to block induced currents.

The deep-well noise shield is often significantly larger than the inductor spiral 102. In one embodiment, the deep-well noise shield covers a surface area of the integrated circuit that encompasses most of the magnetic flux created by the inductor spiral 102. This isolates the inductor from other circuits, such as other similar inductors in the integrated circuit.

In one embodiment, the slot wells subdivide inner well 112 into multiple separate wells as shown. It will be appreciated that each separate well should be independently biased. In another embodiment, the extremities of the slot wells 116, 118, 120, 122, 124, and 126 are omitted, and this electrically connects the inner well 112 together. For example, optional extreme portion 134 of slot well 120 is omitted and corresponding extreme portions are omitted from the other slot wells, such that inner well 112 is electrically connected together around the periphery of inner well 112 near peripheral well 110. Because the inductor's magnetic field is small near these extremities, the inductor induces small currents around the periphery of the inner well 112. Thus, these small induced currents do not appreciably affect the inductance of the inductor spiral 102.

Figure 3:
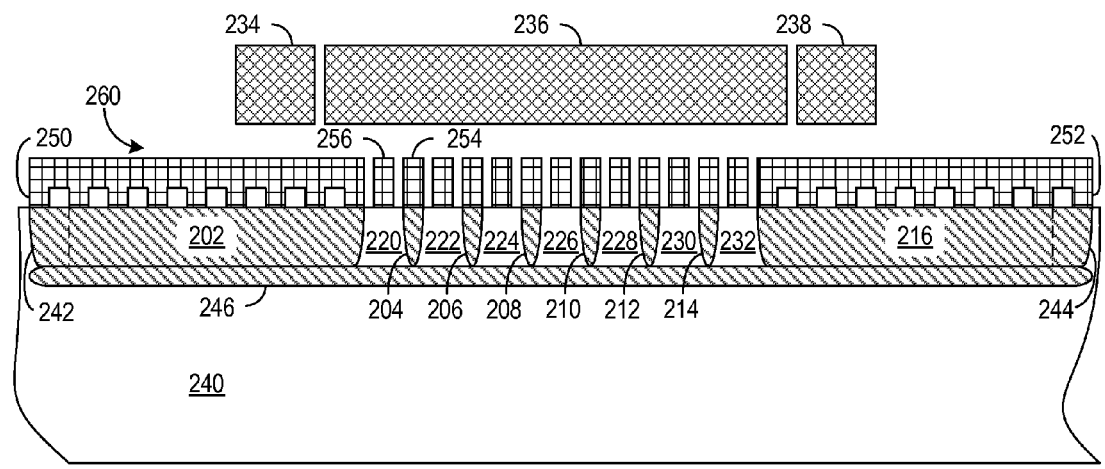
FIG. 3 is a cross-section of the example three-loop inductor of FIG. 2.

FIG. 3 is a cross-section of the example three-loop inductor of FIG. 2 along line 3-3 of FIG. 2. FIG. 3 illustrates an embodiment with slot wells 202, 204, 206, 208, 210, 212, 214, and 216 that subdivide the inner well into separate wells 220, 222, 224, 226, 228, 230, and 232.

The inductor has portions 234, 236, and 238 of the conductive loops of a spiral inductor, and portions 234, 236, and 238 are disposed on the deep-well noise shield for isolating noise coupling between the conductive loops and the substrate 240. The deep-well noise shield includes a peripheral well with portions 242 and 244, and the peripheral well surrounds a periphery of the inner well. The deep-well noise shield includes an inner well (including the separate wells 220, 222, 224, 226, 228, 230, and 232) that is disposed within an outer well produced by the peripheral well and the deep-well layer 246, and the outer well is disposed within substrate 240.

In one embodiment, deep ion implantation creates the deep-well layer 246 inside a semiconductor, and the deep-well layer 246 has a type that is complementary to the type of the semiconductor initially above and below the deep-well layer. For example, the semiconductor is originally a p-type semiconductor, and deep implantation of donor ions creates a buried n-type layer because most of the donor ions pass through a surface layer that remains p-type. In another embodiment, the deep-well layer is an n-type epitaxial layer grown on a p-type semiconductor, and the surface layer is a p-type epitaxial layer grown on the deep-well layer.

The deep-well layer 246 and the portions 242 and 244 of the peripheral well are coupled together to provide two p-n junctions that separate the substrate 240 and the separate wells 220, 222, 224, 226, 228, 230, and 232 of the inner well. The slot wells 202, 204, 206, 208, 210, 212, 214, and 216 are distributed inside the periphery of the inner well. Each slot well 202, 204, 206, 208, 210, 212, 214, or 216 and the deep-well layer 246 are coupled together to separate the inner well into the separate wells 220, 222, 224, 226, 228, 230, and 232.

In one embodiment, the substrate 240 and the inner well are p-type, and the outer well includes the peripheral well with portions 242 and 244, the deep-well layer 246, and the slot wells 202, 204, 206, 208, 210, 212, 214, and 216 that are all n-type.

Contacts 250 and 252 couple the portions 242 and 244 of the peripheral well to a power network of the integrated circuit. Additional contacts couple each of the slot wells 202, 204, 206, 208, 210, 212, 214, and 216 to this power network. For example, contact 254 couples slot well 204 to this power network. The contacts 250, 252, and 254 are coupled to the peripheral well and the slot wells, and the peripheral well and the slot wells are coupled to the deep-well layer 246 to limit a resistance between any portion of the deep-well layer and the power network.

The p-n junction between the deep-well layer 246 and the substrate 240 has a junction capacitance. The resistance of the deep-well layer 246 forms an RC circuit with this junction capacitance. The time constant for this RC circuit is the product of the junction capacitance and resistance between the power network and the deep-well layer 246. When the frequency of the signal in the inductor exceeds a cutoff frequency that is the inverse of this time constant, this p-n junction cannot fully respond to the inductor signal, and the inductor signal induces noise in substrate 240 through a parasitic capacitance between the substrate 240 and the portions 234, 236, and 238 of the inductor. Similarly, for the frequencies exceeding the cutoff frequency, noise in substrate 240 is coupled to the portions 234, 236, and 238 of the inductor. Various embodiments of the invention use the slot wells 202, 204, 206, 208, 210, 212, 214, and 216 to reduce the resistance between the deep-well layer 246 and its biasing power network. This limits the effective resistance of the deep-well layer 246 to increase the cutoff frequency dramatically, such that the deep-well noise shield diverts the noise to the power network. While the diverted noise might produce energy losses that lower the quality factor of the inductor, the noise isolation permits close packing of the inductors, such as an integrated circuit with many transceivers using the inductors for impedance matching with capacitive loading. From the other hand, well-to-well junction capacitance creates a local decoupling capacitor and helps to reduce power supply noise induced by inductor.

Contacts, such as contact 256, couple each separate well 220, 222, 224, 226, 228, 230, or 232 to another power network of the integrated circuit. These contacts are distributed inside the periphery of the inner well between the slot wells 202, 204, 206, 208, 210, 212, 214, and 216. The portion 236 of the conductive loops of the inductor forms a gate of a MOS capacitor with the separate wells 220, 222, 224, 226, 228, 230, and 232 of the inner well. Even when the inner well is biased, the voltage in portion 236 modulates the depletion charge of this MOS capacitor because the inner well is depleted of charge carriers and hence highly resistive. Various embodiments of the invention use contact 256 to create a transverse electric field between separate well 220 and its adjacent slot wells 202 and 204. This binds the depletion charge to reduce sensitivity to modulation of the depletion charge, and provides a low impedance path that diverts noise to the power network. Additional contacts similarly divert noise from modulation of the depletion charge in separate wells 222, 224, 226, 228, 230, and 232.

In one embodiment, a VDD power supply network and a ground power network are interleaved on a lowest metal layer 260 of the integrated circuit. The VDD power supply network follows the length of each of the slot wells 202, 204, 206, 208, 210, 212, 214, and 216 to connect to slot well contacts, such as contact 254. Similarly the ground power supply network follows the length of the separate wells 220, 222, 224, 226, 228, 230, and 232 of the inner well to connect to separate well contacts, such as contact 256.

Figure 4:
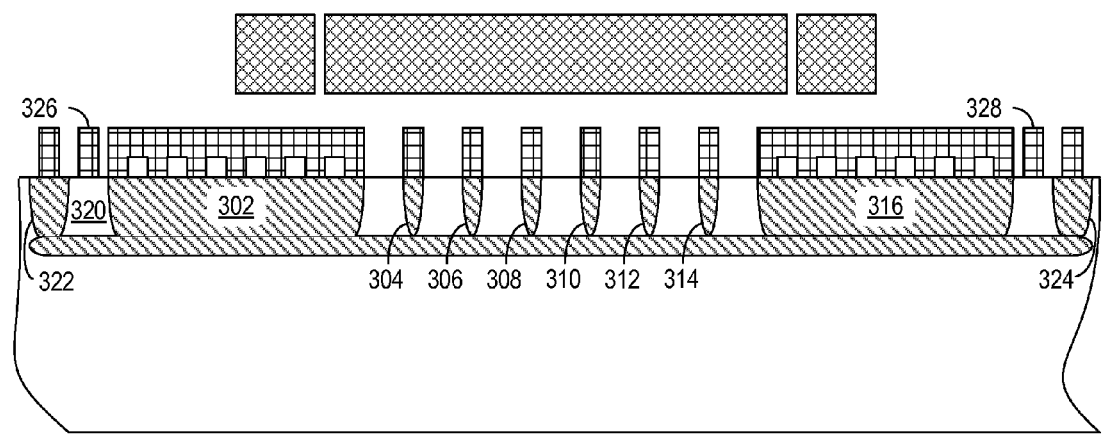
FIG. 4 is a cross-section of a modification of the example three-loop inductor of FIG. 2.

FIG. 4 is a cross-sectional view of a modification of the example three-loop inductor of FIG. 3. FIG. 4 illustrates an embodiment with slot wells 302, 304, 306, 308, 310, 312, 314, and 316 that do not subdivide the inner well 320 into separate wells. Thus, the inner well 320 separates peripheral well with portions 322 and 324 from the slot wells 302, 304, 306, 308, 310, 312, 314, and 316. This corresponds to omitting extreme portion 134 of slot well 120 similar extreme portions in FIG. 2.

FIG. 4 operates similarly to FIG. 3 except that fewer contacts are needed to bias the inner well 320. In one embodiment, as few as one contact biases inner well 320. In the illustrated embodiment, contacts 326 and 328 are distributed around the periphery of the inner well 320. In another embodiment, additional contacts are distributed inside the periphery of the inner well between the slot wells slot wells 302, 304, 306, 308, 310, 312, 314, and 316 to produce a transverse electric field that binds the depletion charge of the inner well 320.

In other embodiments, the inner well 320, the peripheral well 322 and 324, and the slot wells 302, 304, 306, 308, 310, 312, 314, and 316 are shorted together and connected to the either the power supply network or the ground power network. In this embodiment, well-to-well junction capacitance is higher and cutoff frequency is lower. However, the inductor does not create any noise to the power supply network and overall scheme is simplified.

One or more embodiments of the present invention are thought to be applicable to a variety of shielded inductors. Other aspects and embodiments will be apparent to those skilled in the art from consideration of the specification and practice of the one or more embodiments disclosed herein. The embodiments may be implemented as an application specific integrated circuit (ASIC), or on a programmable logic device. It is intended that the specification and illustrated embodiments be considered as examples only, with a true scope and spirit of the invention being indicated by the following claims.

What is claimed is:

1. A shielded inductor, comprising:
a deep-well noise shield that includes a first well disposed within a second well that is disposed within a substrate of an integrated circuit, wherein the second well includes:
a peripheral well that contiguously surrounds a periphery of the first well;
a deep-well layer, wherein the peripheral well and the deep-well layer are coupled together and provide a junction that separates the first well and the substrate; and
a plurality of slot wells that are distributed inside the periphery of the first well, wherein each slot well and the deep-well layer are coupled together;
wherein boundaries of each slot well are defined by a respective first portion and a respective second portion, each respective first portion having a length that is at least three times greater than a width of the respective first portion and a depth that extends from the deep-well layer to a surface of the substrate, each respective second portion having a length that is at least three times greater than a width of the respective second portion and a depth that extends from the deep-well layer to the surface of the substrate, the length of each respective first portion oriented perpendicular to the length of the respective second portion, the length of each respective first portion oriented perpendicular to a respective proximate portion of a plurality of conductive loops, and the length of each respective second portion oriented perpendicular to a respective proximate portion of the plurality of conductive loops;
wherein the first well and the substrate have a first dopant type, and the peripheral well, the deep-well layer, and the slot wells have a second dopant type that is complementary to the first dopant type; and
the plurality of conductive loops disposed on the deep-well noise shield for isolating a noise coupling between the plurality of conductive loops and the substrate.

2. The shielded inductor of claim 1, wherein:
the first well is a p-type well;
the second well is an n-type well and includes the peripheral well that is an n-type well, the deep-well layer that is an n-type layer, and the plurality of slot wells that are a plurality of n-type wells; and
the substrate is a p-type substrate.

3. The shielded inductor of claim 2, further comprising a plurality of contacts coupling the peripheral well and each of the plurality of slot wells to a power network of the integrated circuit, wherein the peripheral well and the plurality of slot wells are coupled to the deep-well layer to limit a resistance between the deep-well layer and the power network.

4. The shielded inductor of claim 3, further comprising another plurality of contacts coupling the first well to another power network of the integrated circuit, the another plurality of contacts distributed inside the periphery of the first well between the plurality of slot wells.

5. The shielded inductor of claim 2, wherein the plurality of slot wells subdivide the first well into a plurality of separate wells, and, for each separate well of the plurality of separate wells, the peripheral well and the deep-well layer provide a junction that separates the separate well and the substrate.

6. The shielded inductor of claim 5, further comprising a plurality of contacts coupling the peripheral well and each of the plurality of slot wells to a power network of the integrated circuit, wherein the peripheral well and the plurality of slot wells are coupled to the deep-well layer to limit a resistance between the deep-well layer and the power network.

7. The shielded inductor of claim 6, further comprising another plurality of contacts coupling the first well to another power network of the integrated circuit, the another plurality of contacts distributed inside the periphery of the first well between the plurality of slot wells.

8. The shielded inductor of claim 2, further comprising a plurality of contacts coupling the peripheral well and each of the plurality of slot wells to a power network of the integrated circuit, wherein the peripheral well and the plurality of slot wells are coupled to the deep-well layer to limit a resistance between the deep-well layer and the power network.

9. The shielded inductor of claim 8, further comprising another plurality of contacts coupling the first well to another power network of the integrated circuit, the another plurality of contacts distributed inside the periphery of the first well between the plurality of slot wells.

10. The shielded inductor of claim 2, wherein the plurality of slot wells subdivide the first well into a plurality of separate wells, and, for each separate well of the plurality of separate wells, the peripheral well and the deep-well layer provide a junction that separates the separate well and the substrate.

11. The shielded inductor of claim 10, further comprising a plurality of contacts coupling the peripheral well and each of the plurality of slot wells to a power network of the integrated circuit, wherein the peripheral well and the plurality of slot wells are coupled to the deep-well layer to limit a resistance between the deep-well layer and the power network.

12. The shielded inductor of claim 11, further comprising another plurality of contacts coupling the first well to another power network of the integrated circuit, the another plurality of contacts distributed inside the periphery of the first well between the plurality of slot wells.

13. The shielded inductor of claim 1, further comprising a plurality of contacts coupling the peripheral well and each of the plurality of slot wells to a power network of the integrated circuit, wherein the peripheral well and the plurality of slot wells are coupled to the deep-well layer to limit a resistance between the deep-well layer and the power network.

14. The shielded inductor of claim 13, further comprising another plurality of contacts coupling the first well to another power network of the integrated circuit, the another plurality of contacts distributed inside the periphery of the first well between the plurality of slot wells.

15. The shielded inductor of claim 1, wherein the length of each slot well is orientated perpendicular to a respective proximate portion of the plurality of conductive loops, and the width of each slot well is orientated parallel to the respective proximate portion.

16. The shielded inductor of claim 15, wherein each slot well includes at least one bend along the length of the slot well between a first portion of the slot well and a second portion of the slot well, and the length of the first and second portions are orientated perpendicular to a respective proximate portion of the plurality of conductive loops.

17. A shielded inductor, comprising:
  a deep-well noise shield that includes a first well disposed within a second well that is disposed within a substrate of an integrated circuit, wherein the second well includes:
    a peripheral well that contiguously surrounds a periphery of the first well;
    a deep-well layer, wherein the peripheral well and the deep-well layer are coupled together, and
    a plurality of slot wells that are distributed inside the periphery of the first well, wherein the plurality of slot wells are coupled to the deep-well layer and subdivide the first well into a plurality of separate wells, and for each separate well of the plurality of separate wells, the peripheral well and the deep-well layer provide a junction that separates the separate well and the substrate;
  wherein boundaries of each slot well are defined by a respective first portion and a respective second portion, each respective first portion having a length that is at least three times greater than a width of the respective first portion and a depth that extends from the deep-well layer to a surface of the substrate, each respective second portion having a length that is at least three times greater than a width of the respective second portion and a depth that extends from the deep-well layer to the surface of the substrate, the length of each respective first portion oriented perpendicular to the length of the respective second portion, the length of each respective first portion oriented perpendicular to a respective proximate portion of a plurality of conductive loops, and the length of each respective second portion oriented perpendicular to a respective proximate portion of the plurality of conductive loops;
  wherein the first well and the substrate have a first dopant type, and the peripheral well, the deep-well layer, and the slot wells have a second dopant type that is complementary to the first dopant type; and
  the plurality of conductive loops disposed on the deep-well noise shield for isolating a noise coupling between the plurality of conductive loops and the substrate.

* * * * *